United States Patent
Brederlow et al.

(10) Patent No.: US 7,012,468 B2
(45) Date of Patent: Mar. 14, 2006

(54) CIRCUIT CONFIGURATION AND METHOD FOR REDUCING THE 1/F NOISE OF MOSFETS

(75) Inventors: Ralf Brederlow, München (DE); Roland Thewes, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 486 days.

(21) Appl. No.: 10/195,196

(22) Filed: Jul. 15, 2002

(65) Prior Publication Data
US 2003/0011249 A1   Jan. 16, 2003

Related U.S. Application Data

(63) Continuation of application No. PCT/EP00/12846, filed on Dec. 16, 2000.

(30) Foreign Application Priority Data
Jan. 13, 2000   (DE) ................................ 100 01 124

(51) Int. Cl.
*H03F 3/16* (2006.01)
(52) U.S. Cl. ........................................ 330/277; 330/10
(58) Field of Classification Search ................ 330/277, 330/296, 10; 257/139, 141
See application file for complete search history.

(56) References Cited

U.S. PATENT DOCUMENTS

| | | | | |
|---|---|---|---|---|
| 4,496,909 A | * | 1/1985 | Knapp | 330/277 |
| 4,626,802 A | * | 12/1986 | Gailus | 331/117 FE |
| 5,498,885 A | * | 3/1996 | Deen et al. | 257/139 |
| 5,970,429 A | * | 10/1999 | Martin | 702/65 |
| 6,333,677 B1 | * | 12/2001 | Dening | 330/296 |
| 6,784,757 B1 | * | 8/2004 | Sibrai et al. | 331/182 |

OTHER PUBLICATIONS

Bram Nauta et al.: "Reduction of 1/f Noise in MOSFETs by Switched Bias Techniques", *Proceedings 17th NORCHIP Conference, Oslo, Norway*, Nov. 8, 1999, pp. 60-72.

Sander L. J. Gierkink et al.: "Intrinsic 1/f Device Noise Reduction and Its Effect on Phase Noise in CMOS Ring Oscillators", *IEEE Journal of Solid-State Circuits*, vol. 34, No. 7, Jul. 1999, pp. 1022-1025.

(Continued)

*Primary Examiner*—Patricia Nguyen
(74) *Attorney, Agent, or Firm*—Laurence A. Greenberg; Werner H. Stemer; Ralph E. Locher

(57) ABSTRACT

The circuit configuration and the associated method allow reducing the 1/f noise of MOSFETs in an electronic circuit, especially in an integrated circuit with one or more MOSFETs. At least one direct current and/or at least one direct voltage source for adjusting constant working point(s) of the MOSFET(s) is/are assigned to one or more or all MOSFETs. At least one periodically oscillating current and/or voltage source is assigned to one or more or all MOSFETs so that the respective working points periodically oscillate about the constant working point(s) in such a manner that impurity states in the oxide of the MOSFET, which are recharged under the condition of a constant working point according to the principles of statistics such that they determine the 1/f noise signal, are no longer recharged statistically but at a lower probability due to the modulatory frequency of the periodically oscillating sources.

16 Claims, 2 Drawing Sheets

OTHER PUBLICATIONS

I. Bloom et al.: "1/f noise reduction of metal-oxide-semiconductor transistors by cycling from inversion to accumulation", *Appl. Phys. Lett.*, vol. 58, No. 15, Apr. 15, 1991, pp. 1664-1666.

Gierkink, S.L.J., et al.: Reducing MOSFET 1/f Noise and Power Consumption by "Switched Biasing", 25th European Solid-State-Circuits Conference, The Hague, Netherlands, pp. 154-157.

* cited by examiner

CIRCUIT CONFIGURATION AND METHOD FOR REDUCING THE 1/F NOISE OF MOSFETS

CROSS-REFERENCE TO RELATED APPLICATION

This application is a continuation of copending International Application No. PCT/EP00/12846, filed Dec. 16, 2000, which designated the United States and which was not published in English.

BACKGROUND OF THE INVENTION

1. Field of the Invention

The invention relates to a circuit configuration and a method for reducing the 1/f noise of MOSFETs in an electronic circuit, in particular in an integrated circuit. The electronic circuit has at least one MOSFET. One or a plurality or all of the MOSFETs are assigned at least one DC current and/or at least one DC voltage source for setting constant operating point(s) of the MOSFET(s). In the method for reducing the 1/f noise of MOSFETs in the electronic circuit, constant operating points are set for the MOSFETs.

During signal transmission, it is often necessary to process small signal amplitudes. The limit for the resolution of a signal amplitude in such systems is determined by the noise of the first amplifier stage and can hardly be influenced.

In particular the 1/f noise, dominant at low frequencies, prevents the processing and transmission of small signal amplitudes in this frequency range.

The prior art discloses various measures for alleviating the problems outlined.

Generally, the LF noise is considered as a fixed limit. This fixed limit can be slightly influenced by a skilful choice of the operating points of the circuit and optimization of the technology used. Such a method or a correspondingly favorably chosen circuit configuration does not eliminate or reduce the noise of the noise source, in other words it does not combat the cause of the noise. As is known, in the case of such a method which does not tackle the causes but rather only the effect, the exertion of influence is only very limited. Accordingly, the possibilities of improvement are largely exhausted in the case of these methods.

It is more promising, therefore, if the causes of the low-frequency noise (LF noise) are tackled.

Thus, in semiconductors, metal layers, oxide layers, etc., a noise with a power density spectrum which is inversely proportional to the frequency f also occurs besides other types of noise. This noise is referred to as 1/f noise (flicker noise). The 1/f noise cannot be explained in simple terms, since it has various causes.

The theory which is currently the most widely accepted for the physical cause of the 1/f noise of components is the theory that the 1/f noise in these components is determined by the random charging and discharging of defect states in these components. For the most important component in microelectronics at the present time, the metal oxide semiconductor field-effect transistor (MOSFET), these are essentially defects in the oxide near the interface with the silicon of the channel region. Here, defects which contribute to the noise are primarily those defects whose energy levels lie in the band gap of the oxide, but in the vicinity of the quasi Fermi level of the charge carriers contributing to the current flow. Defects which, as seen in energy terms, lie far away from this energy level in the band gap of the oxide are either completely charged or discharged and thus do not contribute to the noise.

The document I. Bloom, Y. Nemirovsky, "1/f noise reduction of Metal-Oxide-Semiconductor Transistors by Cycling from Inversion to Accumulation", Applied Physics Letters, Vol. 58 (15), pages 1664–66, Apr. 15, 1991, shows that the charging and discharging times of the defect states causing the noise in the vicinity of the quasi Fermi level are of similar magnitude, whereas the charging and discharging times of defect states that are remote from the quasi Fermi levels differ greatly. Accordingly, such states are virtually exclusively charged or discharged. Accordingly, a defined state is always established.

In the publication presented by I. Bloom and Y. Nemirovsky, a depletion-mode n-channel MOSFET is operated in such a way that the gate-source voltage is changed over between a value of $V_{GS}=5$ V, which signifies inversion and consequently conduction of the channel, and $V_{GS}=-3$ V, which signifies accumulation and accordingly a nonconductive channel. The explanations in this document are limited to observing the noise reduction; a possible use in more complex circuits is not investigated.

The printed publication by S. L. J. Gierkink, E. A. M. Klumperink, E. van Tuijl, B. Nauta, "Reducing MOSFET 1/f Noise and Power Consumption by "Switched Biasing", Proceedings of the 25th European Solid-State-Circuits Conference, pages 154–57, The Hague, The Netherlands, 1999, presents the applicability of the method cited above to a coupled sawtooth ring oscillator.

In that ring oscillator, a MOS transistor is periodically changed over between the following two states:

(1) an "operating state" or "active state" with strong inversion, wherein the transistor contributes to the functional operation of the circuit (in other words, supplies a bias current.

(2) a "quiescent state" or "inactive state" in or in the vicinity of the accumulation state, for practical purposes $V_{GS}=0$ V. In this state, the MOS transistor is not in operation.

The advantage of that circuit configuration is that, on the one hand, the energy consumption is reduced in the quiescent state, although what is much more important is that the 1/f noise of the MOS transistor is reduced during the active state.

This document already points out the limited area of use for the method or the circuit configuration. Thus, the authors point out in the printed publication that the method can be employed only when "a bias current is only needed during certain time intervals or because the signal processing does not take place continuously."

SUMMARY OF THE INVENTION

It is accordingly an object of the invention to provide a circuit configuration and a method for reducing the 1/f noise of MOSFETs, which overcomes the above-mentioned disadvantages of the heretofore-known devices and methods of this general type. In particular, the transistor or transistors is or are no longer intended to be changed over between an operating state and a quiescent state, rather the transistor or transistors of a circuit is or are intended to enable continuous operation.

With the foregoing and other objects in view there is provided, in accordance with the invention, a circuit configuration for reducing 1/f noise of a MOSFET in an electronic circuit, such as an integrated circuit, with at least one MOSFET, comprising:

a DC source selected from the group consisting of a DC current source and a DC voltage source connected to the MOSFET for setting a constant operating point of the MOSFET;

a periodically oscillating source selected from the group consisting of a periodically oscillating current source and a periodically oscillating voltage source connected to the MOSFET for causing a periodic oscillation of the operating point about the constant operating point prescribed by the DC source, such that defect states in an oxide of the MOSFET that are subjected to charge reversal under a condition of the constant operating point according to the laws of statistics and thus determine a 1/f noise signal, are no longer subjected to charge reversal statistically, but rather, on account of a modulation frequency of the periodically oscillating source, are subjected to charge reversal no longer to an equal extent.

In accordance with an added feature of-the invention, the electronic circuit has a plurality of MOSFETs, and the DC source is at least one DC source connected to some or all of the plurality of MOSFETs, and the periodically oscillating source is at least one periodically oscillating source connected to some or all of the plurality of MOSFETs.

In accordance with an additional feature of the invention, an inverse modulation frequency of the periodically oscillating source is less than an equilibrium time constant of a dominant noisy defect.

In accordance with another feature of the invention, the amplitude of the periodically oscillating source is chosen such that a voltage swing, which shifts a respective quasi Fermi level of charge carriers contributing to a current flow at a location of noise-causing defects, is greater than an equivalent of a few thermal voltages (kT/e).

In accordance with a further feature of the invention, the amplitude of the periodically oscillating source is chosen such that the operating point of the MOSFET is shifted between weak inversion and strong inversion or between depletion and strong inversion.

With the above and other objects in view there is also provided, in accordance with the invention, a method for reducing 1/f noise of a MOSFET in an electronic circuit (e.g., an integrated circuit) having one or more MOSFETs, which comprises:

setting a predetermined constant operating point of the MOSFET;

causing the operating point to periodically oscillate about the predetermined constant operating point such that defect states in an oxide of the MOSFET, that are subjected to charge reversal under a condition of a constant operating point according to laws of statistics and thereby cause the 1/f noise signal, are no longer subjected to charge reversal statistically, but rather, on account of a modulation frequency are subjected to charge reversal with lower probability.

The method for reducing the 1/f noise of MOSFETs in an electronic circuit, in particular in an integrated circuit, proceeds from the fact that constant or fixed operating points of the MOSFETs are set in such a circuit with the aid of DC current or DC voltage sources. As is known—as already explained above—such electronic circuits, in particular integrated circuits, have a high low-frequency noise signal, which is caused predominantly by the 1/f noise.

The primary concept of the invention consists in the fact that the respective operating points are periodically varied about the constant operating points prescribed by the DC voltage and/or DC current source(s) in such a way that defect states in the oxide, which are subjected to charge reversal under the condition of a constant, fixedly prescribed operating point statistically so often that the 1/f noise signal that they bring back dominates the low-frequency noise signal, are no longer subjected to charge reversal statistically, but rather are subjected to charge reversal with the oscillation frequency of the periodically varied operating points.

In a corresponding circuit configuration for reducing the 1/f noise of MOSFETs, it is therefore provided that the constant-current and/or constant-voltage sources which prescribe the constant fixed operating points are additionally assigned oscillating AC current and/or AC voltage sources. This is achieved by the periodic charge reversal of the defect states in that a defined, rather than statistical charging and discharging takes place. A defined charge reversal of such states signifies a reduction of the low-frequency noise amplitude.

In an advantageous manner, the source or the sources must satisfy the following conditions depending on each circuit:

a) the inverse modulation or oscillation frequency must be rapid relative to the equilibrium time constants of the noisy defects, b) the modulation frequency should lie outside the useful band (apart from exceptions; in this respect, see exemplary embodiment 3 presented below), c) the amplitude of the modulated source must be set in such a way that the voltage swing which shifts the quasi Fermi level is greater than the equivalent of a few thermal voltages (kT/e). In the case of a MOSFET, the operating range should thus be shifted between weak inversion (or depletion) and strong inversion.

The condition mentioned under a) constrains a charge reversal in time with the oscillation. At lower modulation frequencies noise suppression is not ensured since the defects continue to be subjected to charge reversal predominantly statistically and thus contribute to the noise.

A modulation frequency which lies outside the useful band used ensures that the useful signals to be processed and the interference signals arising as a result of the oscillation of the operating point can be separated again. The nonlinearities that possibly occur on account of the fluctuating operating points can be compensated for by external feedback. If the modulation frequency is sufficiently high relative to the frequency band wherein the circuit operates, then the fluctuations in the output signals which are produced by the modulation average out.

The condition specified under c), namely that the quasi Fermi level must be shifted in such a way that they fluctuate by a few kT, is the prerequisite for a defined, no longer statistically dominated charge reversal.

Other features which are considered as characteristic for the invention are set forth in the appended claims.

Although the invention is illustrated and described herein as embodied in a circuit configuration and a method for reducing the 1/f noise of MOSFETs, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
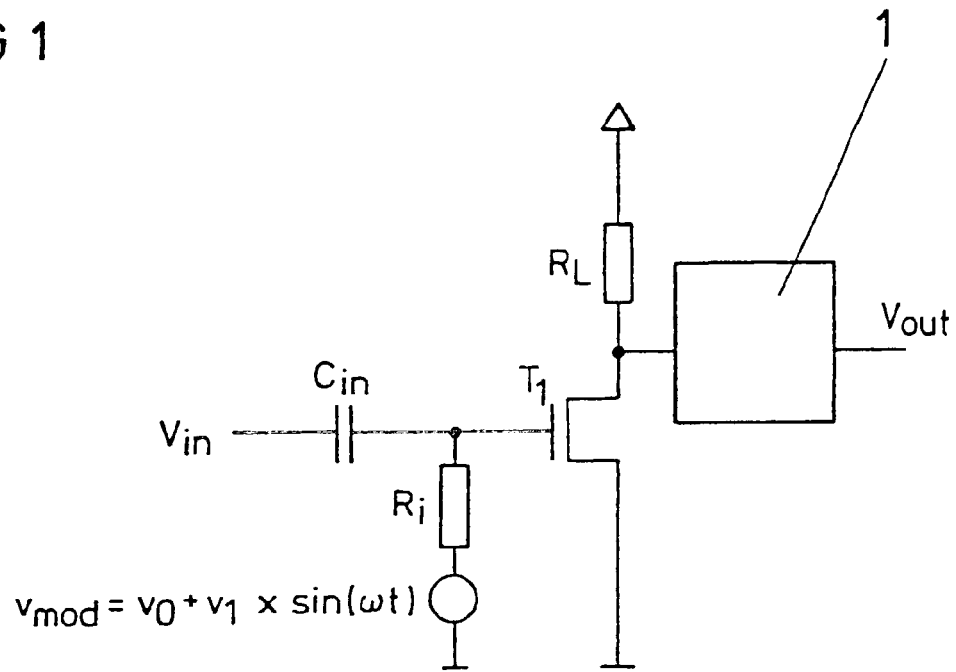
FIG. 1 is a circuit schematic of a simple amplifier stage with circuitry according to the invention.

Referring now to the figures of the drawing in detail and first, particularly, to FIG. 1 thereof, there is shown a first example for the application of the 1/f noise reduction principle according to the invention. The figure illustrates a case of a simple amplifier stage. The simple amplifier stage comprises a depletion-mode n-channel MOSFET $T_1$. In the figure, the source electrode is connected to ground. The drain electrode of the transistor $T_1$ is connected to the supply voltage via a load resistor $R_L$. At the same time, the drain electrode is connected to a low-pass filter 1. A voltage source with the internal resistance $R_i$ is connected to the gate electrode. The operating point of the transistor $T_1$ is set with the aid of the voltage source.

Therefore, a DC voltage component $V_0$ is usually applied to the voltage source. According to the invention, an AC voltage component is superposed on the DC voltage component $V_0$. In this case, a sinusoidal AC voltage is applied with an AC voltage amplitude $V_1$ and a modulation angular frequency $\omega$. The operating point is thus determined by the modulation voltage $$V_{mod}=V_0+V_1 \cdot \sin(\omega t)$$

where t stands for the time.

An input voltage $V_{in}$ to be amplified is fed to the gate electrode via the input capacitance $C_{in}$ and is present at the output of the low-pass filter 1 as the output $V_{out}$.

It is advantageous if the modulation frequency $\omega$ is large relative to the maximum signal frequency. The cut-out frequency of the low-pass filter ideally lies between the maximum signal frequency and the modulation frequency $\omega$. On the one hand, this ensures that the modulation frequency is sufficiently high relative to the frequency band wherein the circuit operates, so that the fluctuations in the output signals that are produced by the modulation average out, and on the other hand these interference signals generated by the high-frequency modulation of the operating point are efficiently filtered out with the aid of the low-pass filter 1.

Figure 2:
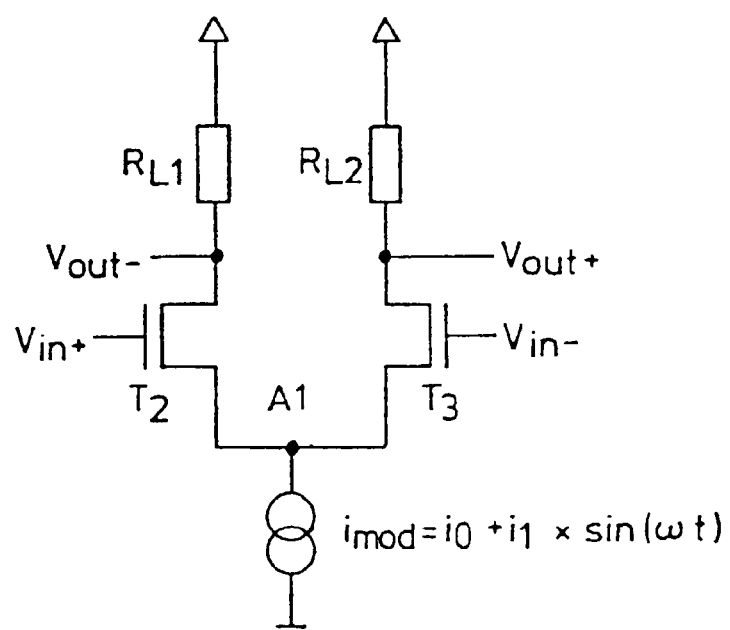
FIG. 2 is a circuit schematic of a simple differential stage with circuitry according to the invention.

FIG. 2 shows the application of the 1/f noise reduction principle according to the invention in the case of a simple differential stage. The differential stage in this case comprises two depletion-mode n-channel MOSFETs $T_2$ and $T_3$, wherein the respective source electrodes are connected to the node A1. The node A1 is grounded via a current source. The drain electrodes are connected to the supply voltage via a respective load resistor $R_{L1}$ and $R_{L2}$.

The operating point of the differential amplifier is set by the current source. As in the previous example, the modulation of the operating point is again achieved by virtue of the fact that the current $i_{mod}$ of the current course is composed of a DC component $i_0$ and a sinusoidal AC component with the amplitude $i_1$ and the modulation angular frequency $\omega$:

$$i_{mod}=i_0+i_1 \cdot \sin(\omega t).$$

The differential amplifier stage is operated as usual in such a way that a voltage is applied between the gate electrodes of the transistors $T_2$ and $T_3$. These electrode voltages are identified by $V_{in+}$ $V_{in-}$ in the drawing, where $V_{in}=V_{in+}-V_{in-}$. The output signal is tapped off as differential signal $V_{out}=V_{out+}-V_{out-}$ between the drain electrodes of the transistors $T_3$ and $T_2$. On account of the differential signal processing, the modulation of the current source has, to a first approximation, no influence on the output signal $V_{out}=V_{out+}-V_{out-}$.

Figure 3:
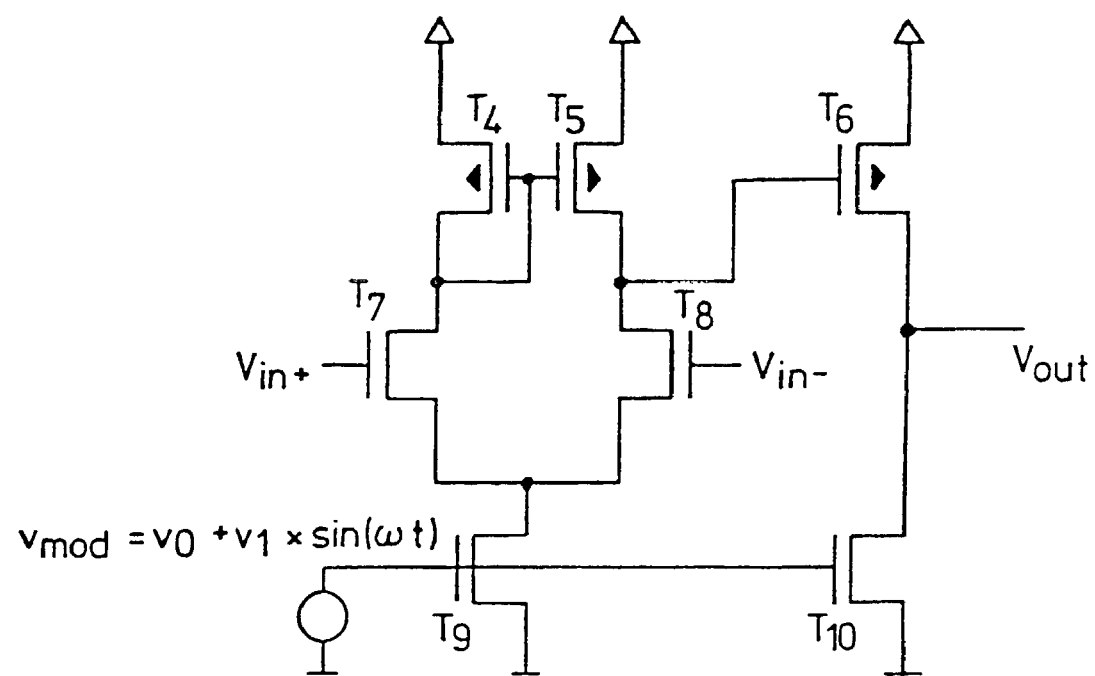
FIG. 3 is a circuit schematic of a simple MOS operational amplifier with circuitry according to the invention.

FIG. 3 illustrates a simple MOS operational amplifier as a third example of the circuit configuration according to the invention. FIG. 3 reveals that the operational amplifier comprises seven transistors $T_4$ to $T_{10}$. In the example, the transistors $T_4$ to $T_6$ are depletion-mode p-channel MOSFETs, and the transistors $T_7$ to $T_{10}$ are depletion-mode n-channel MOSFETs.

These transistors are connected up as follows:

The source electrode of the transistor $T_{10}$ is grounded. The drain electrode of the transistor $T_{10}$ is connected to the source electrode of the transistor $T_6$. The drain electrode of the transistor $T_6$ is connected to the supply voltage. The source electrode of the transistor $T_9$ is grounded. The drain electrode of the transistor $T_9$ is connected to the source electrodes of the transistors $T_7$ and $T_8$. The drain electrode of the transistor $T_7$ is connected to the source electrode of the transistor $T_4$ and the gate electrodes of the transistors $T_4$ and $T_5$. The drain electrode of the transistor $T_8$ is connected to the source electrode of the transistor $T_5$ and the gate electrode of the transistor $T_6$. The drain electrodes of the transistors $T_4$ and $T_5$ are connected to the supply voltage. The gate electrodes of the transistors $T_7$ and $T_8$ form the inverting input $V_{in+}$ and the noninverting input $V_{in-}$ respectively. The drain electrode of the transistor $T_{10}$ and the source electrode of the transistor $T_6$ form the output $V_{out}$ of the operational amplifier.

The operating point of the operational amplifier is set by a voltage source connected to the gate electrodes of the transistors $T_9$ and $T_{10}$. As in the previous examples, it was provided according to the invention that the voltage $V_{mod}$ for operating-point setting again comprises a DC component vo and a sinusoidal AC component with the amplitude $v_1$ and the modulation frequency $\omega$.

$$V_{mod}=V_0+V_1 \cdot \sin(\omega t)$$

On account of the fact that the modulation is applied both to the input branch and output branch it has, to a first approximation, no influence on the output signal $V_{out}$ given suitable dimensioning and operating-point setting. In this case, too, it is not necessary that the condition b) mentioned in the introduction to the description, according to which the modulation frequency should lie outside the useful band of the input signal, hold true. Nonlinearities that possibly occur on account of the fluctuating operating points can be compensated for by external feedback.

We claim:

1. A circuit configuration for reducing 1/f noise of at least one MOSFET in an electronic circuit, comprising:
   a voltage source for supplying a voltage to be amplified to a gate electrode of the at least one MOSFET;
   at least one DC current or DC voltage source connected to the MOSFET, said at least one DC current or DC voltage source delivering a DC current or a DC voltage for setting a constant operating point of the at least one MOSFET;

a periodically oscillating current or voltage source connected to the at least one MOSFET, said periodically oscillating current or voltage source generating an alternating current overlaying said DC current or an alternating voltage overlaying said DC voltage for causing a periodic oscillation of the operating point about the constant operating point prescribed by said DC current or voltage source, such that defect states in an oxide of the MOSFET that are subjected to charge reversal under a condition of the constant operating point according to the laws of statistics and a 1/f noise signal, are no longer subjected to charge reversal statistically, but rather are subjected to a predefined charge reversal based on a modulation frequency of said alternating current or said alternating voltage.

2. The circuit configuration according to claim 1, wherein the electronic circuit has a plurality of MOSFETs, and said at least one DC current or DC voltage source is connected to some of said plurality of MOSFETs, and said periodically oscillating current or voltage source is at least one periodically oscillating current or voltage source connected to some of said plurality of MOSFETs.

3. The circuit configuration according to claim 1, wherein the electronic circuit has a plurality of MOSFETs, and said DC current or DC voltage source and said periodically oscillating current or voltage source are connected to all of said MOSFETS.

4. The circuit configuration according to claim 1, wherein an inverse modulation frequency of said periodically oscillating current or voltage source is less than an equilibrium time constant of a dominant noisy defect.

5. The circuit configuration according to claim 1, wherein an amplitude of said periodically oscillating current or voltage source is chosen such that a voltage swing, which shifts a respective quasi Fermi level of charge carriers contributing to a current flow at a location of noise-causing defects, is greater than an equivalent of a few thermal voltages.

6. The circuit configuration according to claim 5, wherein an amplitude of said periodically oscillating current or voltage source is chosen such that the operating point of the at least one MOSFET is shifted between weak inversion and strong inversion.

7. The circuit configuration according to claim 5, wherein an amplitude of said periodically oscillating current or voltage source is chosen such that the operating point of the MOSFET is shifted between depletion and strong inversion.

8. The circuit configuration according to claim 1, wherein the electronic circuit is an integrated circuit.

9. A method for reducing 1/f noise of a MOSFET in an electronic circuit having at least one MOSFET, which comprises:

supplying a gate electrode of the at least one MOSFET with a voltage to be amplified and setting the at least one MOSFET with an operating point;

setting the operating point by applying a DC current being overlaid by a periodically oscillating current or a DC voltage being overlaid by a periodically oscillating voltage;

causing the operating point to periodically oscillate about a predetermined constant operating point such that defect states in an oxide of the MOSFET that are subjected to charge reversal under a condition of a constant operating point according to laws of statistics and a 1/f noise signal, are no longer subjected to charge reversal statistically, but rather, are subjected to a predefined charge reversal based on a modulation frequency of the periodically oscillating current or the periodically oscillating voltage.

10. The method according to claim 9, which causes setting respective operating points of some or all of the MOSFETs of the electronic circuit and adding a periodic oscillation signal to some or all of the MOSFETs.

11. The method according to claim 9, which comprises adjusting an inverse oscillation frequency to less than an equilibrium time constant of dominant noisy defects.

12. The method according to claim 9, which comprises choosing an amplitude of the oscillation of the operating point such that a voltage swing shifting a respective quasi Fermi level of the charge carriers contributing to the current flow, is greater than an equivalent of a few thermal voltages.

13. The method according to claim 12, which comprises shifting the operating point of the MOSFET between weak inversion and strong inversion.

14. The method according to claim 12, which comprises shifting the operating point of the MOSFET between depletion and strong inversion.

15. A circuit configuration for reducing 1/f noise of a MOSFET in an electronic circuit having a plurality of MOSFETs, comprising:

at least one DC source selected from the group consisting of a DC current source and a DC voltage source connected to some or all of the plurality of MOSFETs for setting a constant operating point of the MOSFETs; and at least one periodically oscillating source selected from the group consisting of a periodically oscillating current source and a periodically oscillating voltage source connected to some or all of the plurality of MOSFETs for causing a periodic oscillation of the operating point about the constant operating point prescribed by said DC source.

16. The method according to claim 9, wherein the electronic circuit is an integrated circuit.

* * * * *